(12) United States Patent
Tanida et al.

(10) Patent No.: US 8,309,430 B2
(45) Date of Patent: Nov. 13, 2012

(54) SEMICONDUCTOR MANUFACTURING APPARATUS AND SEMICONDUCTOR MANUFACTURING METHOD

(75) Inventors: Kazumasa Tanida, Kanagawa (JP); Naoko Yamaguchi, Kanagawa (JP); Satoshi Hongo, Tokyo (JP); Chiaki Takubo, Tokyo (JP); Hideo Numata, Kanagawa (JP)

(73) Assignee: Kabushiki Kaisha Toshiba, Tokyo (JP)

( * ) Notice: Subject to any disclaimer, the term of this patent is extended or adjusted under 35 U.S.C. 154(b) by 89 days.

(21) Appl. No.: 13/035,182

(22) Filed: Feb. 25, 2011

(65) Prior Publication Data

US 2011/0217795 A1 Sep. 8, 2011

(30) Foreign Application Priority Data

Mar. 3, 2010 (JP) ................................ 2010-047029

(51) Int. Cl.
  *H01L 21/30* (2006.01)
  *B32B 37/00* (2006.01)
  *B32B 41/00* (2006.01)
(52) U.S. Cl. ............ 438/455; 156/60; 156/64; 156/378; 156/556
(58) Field of Classification Search .................. None
  See application file for complete search history.

(56) References Cited

U.S. PATENT DOCUMENTS

| | | | | |
|---|---|---|---|---|
| 6,979,629 B2 * | 12/2005 | Yanagita et al. | ............... | 438/458 |
| 7,479,441 B2 | 1/2009 | Kirk et al. | | |
| 7,896,046 B2 * | 3/2011 | Park | ............... | 156/358 |
| 2003/0168176 A1 * | 9/2003 | Byun et al. | ............... | 156/382 |
| 2005/0022938 A1 * | 2/2005 | Masuda | ............... | 156/580 |
| 2010/0323193 A1 * | 12/2010 | Matsuo et al. | ............... | 428/336 |
| 2011/0083786 A1 * | 4/2011 | Guo et al. | ............... | 156/64 |
| 2011/0168317 A1 * | 7/2011 | Deming et al. | ............... | 156/64 |

FOREIGN PATENT DOCUMENTS

| | | |
|---|---|---|
| JP | 2-106052 | 4/1990 |
| JP | 5-275507 | 10/1993 |
| JP | 10-135295 | 5/1998 |
| JP | 2003-98073 | 4/2003 |

* cited by examiner

*Primary Examiner* — Scott B Geyer
(74) *Attorney, Agent, or Firm* — Finnegan, Henderson, Farabow, Garrett & Dunner, L.L.P.

(57) ABSTRACT

According to one embodiment, a first substrate and a second substrate are pressed from an opposite surface of a joint surface of the second substrate such that a joint surface of the first substrate and the joint surface of the second substrate are in contact with each other. The second substrate is restrained by a member to provide a gap between the joint surfaces. It is determined, based on a temporal change of a joint interface calculated based on an image imaged from the opposite surface side of the joint surface, whether joining is normally performed.

20 Claims, 2 Drawing Sheets

SEMICONDUCTOR MANUFACTURING APPARATUS AND SEMICONDUCTOR MANUFACTURING METHOD

CROSS-REFERENCE TO RELATED APPLICATIONS

This application is based upon and claims the benefit of priority from the prior Japanese Patent Application No. 2010-047029, filed on Mar. 3, 2010; the entire contents of which are incorporated herein by reference.

FIELD

Embodiments described herein relate generally to a semiconductor manufacturing apparatus and a semiconductor manufacturing method.

BACKGROUND

A back-illuminated image sensor is devised in which a light receiving surface of a photodiode is provided on the rear surface of a semiconductor substrate contrasted with a front-illuminated image sensor in the past in which light is made incident from the front surface of a semiconductor substrate. In the back-illuminated image sensor, because it is unnecessary to form wires and unnecessary films on the light receiving surface, sensitivity higher than that of the front-illuminated image sensor can be obtained.

In the back-illuminated image sensor, it is necessary to reduce the semiconductor substrate in thickness to efficiently collect, on a photodiode, light made incident on the rear surface of the semiconductor substrate. The thickness of the semiconductor substrate needs to be set to thickness for preventing resolution from being deteriorated until charges generated on the light receiving surface are diffused and collected on the photodiode. For example, when visible light is made incident, the thickness needs to be set to be smaller than 20 micrometers.

Such a back-illuminated image sensor is formed by, for example, a method explained below. First, a semiconductor substrate having a photodiode and an integrated circuit formed on the front surface thereof is prepared. A supporting substrate having a diameter substantially the same as that of the semiconductor substrate is joined to the front surface side of the semiconductor substrate. The semiconductor substrate is reduced in thickness from the rear surface side to near the photodiode to form a light-receiving surface on the rear surface of the semiconductor substrate. The supporting substrate functions as a reinforcing member when the semiconductor substrate is reduced in thickness. A reflection preventing film, a color filter, a condensing micro-lens, and the like are provided on the light receiving surface.

Further, an electrode section electrically connected to the integrated circuit on the front surface is formed on the rear surface of the semiconductor substrate. Thereafter, a joined member of the semiconductor substrate and the supporting substrate are cut and divided by a dicing blade. Divided chips are bonded to a ceramic package or the like and electrode sections of the chips and wires formed on the ceramic package are electrically connected by wire bonding to obtain a semiconductor device. In this way, the semiconductor substrate having a function of a so-called back-illuminated image sensor is formed.

In the semiconductor device, the semiconductor device is reduced in thickness from the rear surface of the semiconductor device to a layer on the front surface in which the photodiode is formed. When the semiconductor device is reduced in thickness, the semiconductor substrate is reduced in thickness halfway by mechanical grinding or chemical mechanical polishing. To efficiently collect energy beams on the photodiode, the semiconductor substrate is desirably formed as thin as possible. However, because the semiconductor substrate is reduced in thickness, when the integrated circuit (including metal wires and insulative film) is formed on the front surface of the semiconductor substrate, residual stress is concentrated on a joint surface side of the semiconductor substrate and the supporting substrate. Therefore, the joining of the semiconductor substrate and the supporting substrate is desirably performed by a joining method for reducing the influence of the residual stress. Because a high-temperature process is necessary in forming an electrode on the rear surface of the semiconductor substrate, the method of joining the semiconductor substrate and the supporting substrate is desirably a method of joining the semiconductor substrate and the supporting substrate not via an organic material. Consequently, the method of joining the semiconductor substrate and the supporting substrate is desirably a direct joining system for directly connecting the front surface section of the semiconductor substrate and the front surface section of the supporting substrate wirelessly (see, for example, the specification of U.S. Pat. No. 7,479,441).

In the direct joining system, a joining starting point is formed by pressing a predetermined one point. A joint interface spontaneously expands from the joining starting point in an isotropic manner. However, a joining property of the direct joining substantially depends on a state of the substrate front surface. Therefore, when flatness and cleanness of the front surface are deteriorated, expansion speed of the joint interface decreases, the isotropic expansion of the joint interface is deteriorated, an air layer is entrained in the joint interface. As a result, a void occurs, the expansion of the joint interface is stopped halfway, and an un-joined section is formed. When the un-joined section is formed, when the semiconductor substrate is reduced in thickness, separation of the semiconductor substrate and the supporting substrate, a break of the thin semiconductor substrate, or the like occurs, and the yield of generation of the semiconductor device decreases. When the separation or the break does not occur, if a void is present, the thin semiconductor substrate is deformed, the light receiving surface is distorted, and an imaging characteristic is deteriorated.

DETAILED DESCRIPTION

In general, according to one embodiment, in a semiconductor manufacturing apparatus that joins a joint surface of a first substrate and a joint surface of a second substrate, the first substrate and the second substrate arranged to oppose the joint surfaces thereof each other are pressed in a predetermined position on an opposite surface of the joint surface of the second substrate such that the joint surface of the first substrate and the joint surface of the second substrate are in contact with each other. A gap is provided between the joint surface of the first substrate and the joint surface of the second substrate by a member that restrains the second substrate. The semiconductor manufacturing apparatus includes: a sensor unit that images an image including a plane area of the first substrate from the opposite surface side of the joint surface of the second substrate or from an opposite surface side of the joint surface of the first substrate; and a processing unit that calculates, based on the image, a joint interface and determines, based on a rate of change of the joint interface, whether joining is normally performed.

Exemplary embodiments of a semiconductor manufacturing apparatus and a semiconductor manufacturing method will be explained below in detail with reference to the accompanying drawings. The present invention is not limited to the following embodiments.

Figure 1:
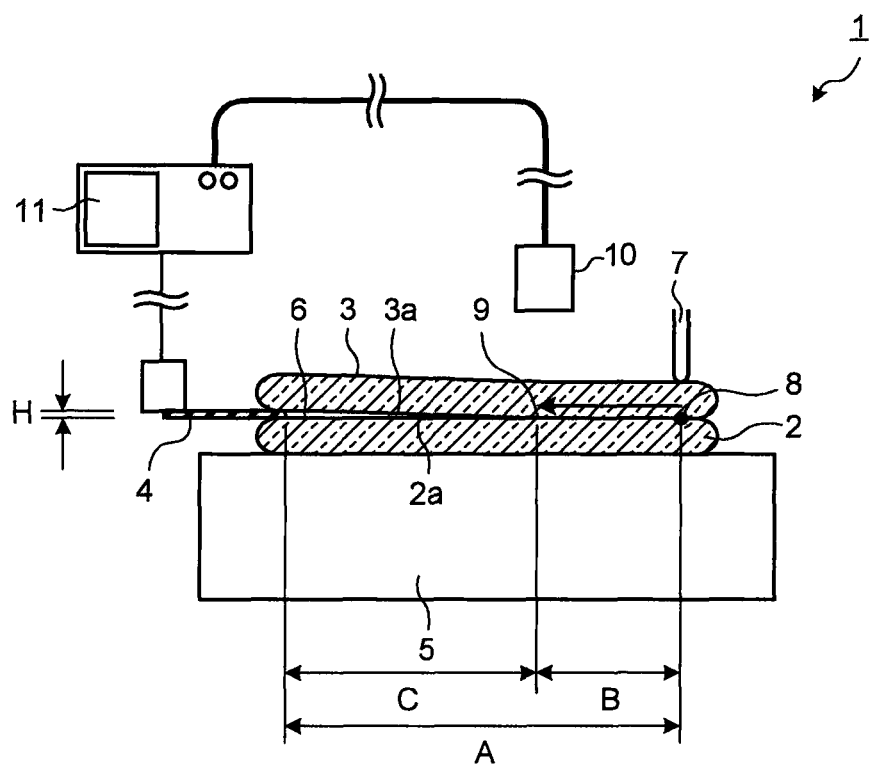
FIG. 1 is a diagram of a configuration example of a semiconductor manufacturing apparatus according to a first embodiment.

FIG. 1 is a diagram of a configuration example of a semiconductor manufacturing apparatus 1 according to a first embodiment. The semiconductor manufacturing apparatus 1 according to this embodiment is a semiconductor manufacturing apparatus for directly joining a first substrate 2 and a second substrate 3. The semiconductor manufacturing apparatus 1 according to this embodiment includes a spacer 4, a stage 5, a pressing member 7, a sensor unit 10, and a processing unit 11. In FIG. 1, a sectional view of the semiconductor manufacturing apparatus 1 according to this embodiment in which the first substrate 2 and the second substrate 3 to be joined are set (including the first substrate 2 and the second substrate 3) is shown.

Figure 2:
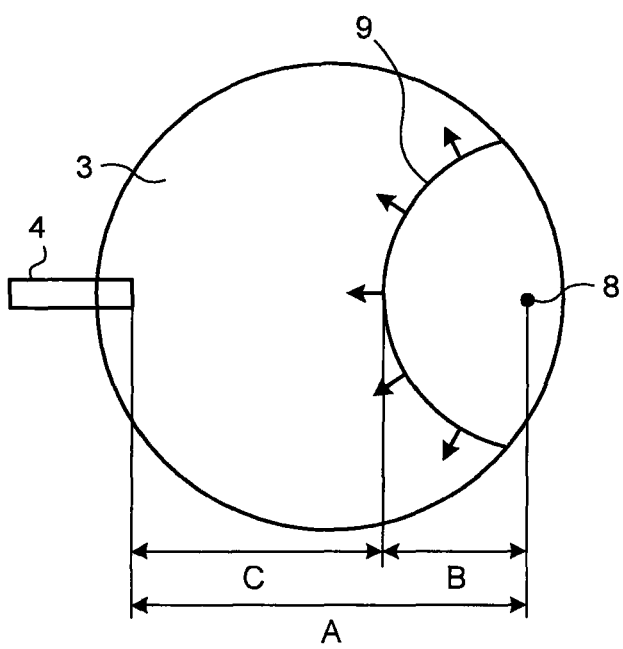
FIG. 2 is a diagram of an example of a joined state of a first substrate and a second substrate.

FIG. 2 is a diagram of an example of a joined state of the first substrate 2 and the second substrate 3. FIG. 2 is an example of a plan view of the semiconductor manufacturing apparatus 1 according to this embodiment looked down from an upper side (the sensor unit 10 side) to the first substrate 2 and the second substrate 3 to be joined. In the figures, the same reference numerals and signs denote the same components or the same parameters.

The stage 5 is a component for supporting a substrate to be joined. In FIG. 1, the first substrate 2 is mounted on the stage 5 of the semiconductor manufacturing apparatus 1 as the substrate to be joined. The first substrate 2 is arranged such that a joint surface 2a of the first substrate 2 corresponds to the second substrate 3. The substrate 2 can be a substrate made of any material. For example, the first substrate 2 can be a semiconductor substrate. For example, when a back-illuminated image sensor is manufactured, the first substrate 2 is a semiconductor substrate. An active layer (not shown) in which a photodiode and a transistor are formed and a wiring layer (not shown) electrically connected to the active layer are formed on the front surface of the first substrate 2. The active layer and the wiring layer are covered with an insulating layer. The surface of the insulating layer is the joint surface 2a.

The second substrate 3 is a substrate joined to the first substrate 2. The second substrate 3 is mounted on the first substrate 2 with the spacer 4 inserted between the second substrate 3 and the first substrate 2 such that a joint surface 3a of the second substrate 3 is opposed to the joint surface 2a of the first substrate 2. Because the spacer 4 is inserted between the second substrate 3 and the first substrate 2, a gap 6 is formed to set a distance between the joint surface 2a and the joint surface 3a to a predetermined value. The distance between the joint surface 2a and the joint surface 3a is represented as distance H. The distance H is different depending on a plane position of the first substrate 2. The distance H is the largest in an outer circumferential position of the first substrate 2 where the spacer 4 is inserted. The distance H decreases toward a joining starting point.

The spacer 4 can be in contact with or can be apart from the joint surface 2a of the first substrate 2. The shape of the spacer 4 can be any shape such as a tabular shape, a tilting shape, a columnar shape, or a conical shape as long as the gap 6 can be formed between the first substrate 2 and the second substrate 3. The conical shape is suitable to reduce a contact area with the joint surfaces as much as possible. A material of the spacer 4 can be any material. For example, metal such as SAS or aluminum, ceramic, a resin material, or the like can be used. To prevent metal contamination of a substrate to be joined, it is desirable to use a material other than metal. For example, a resin material such as fluorine resin or polyetheretherketone (PEEK (registered trademark)) can be used.

In this embodiment, as explained above, the first substrate 2 and the second substrate 3 mounted on the stage 5 are pressed by the pressing member 7 from the rear surface (a surface that is not the joint surface 3a) side of the second substrate 3. The joint surface 2a of the first substrate 2 and the joint surface 3a of the second substrate 3 are brought into contact with each other by this pressing. Joining is started with a point where this contact occurs set as a joining starting point 8. In FIG. 2, a joined region is shown as a joint interface 9 (an interface of the joined region with an un-joined region). The joint interface 9 expands from the joining starting point 8 to the outer side (a direction away from the joining starting point 8) in an isotropic manner.

The shape of the distal end of the pressing member 7 can be any shape such as a plane or a needle shape. From the viewpoints that local pressing is desirable to form the joining starting point with high reproducibility and the joining starting point has abrasion resistance, it is effective to form the distal end shape of the pressing member 7 in a semispherical shape having a predetermined curvature.

In this embodiment, expansion speed of the joint interface 9 is calculated. It is determined based on the expansion speed whether joining is appropriately performed. When the expansion speed of the joint interface 9 is low, flatness and cleanness the front surface are deteriorated and the joining is not normally performed. It is highly likely that a void occurs. Therefore, in this embodiment, by monitoring the expansion speed of the joint interface 9, it is determined whether the joining is normally performed. A substrate that is not normally joined is excluded and manufacturing of a semiconductor device proceeds to the next process. This makes it possible to improve yield in subsequent processes and improve efficiency of the manufacturing of the semiconductor device.

In the configuration example shown in FIGS. 1 and 2, one spacer 4 is arranged. However, a plurality of the spacers 4 can be arranged. When a plurality of the spacers 4 are arranged, for example, the spacers 4 are arranged to be inserted between the joint surface 2a and the joint surface 3a from positions different from one another on the periphery of the first substrate 2 in a direction to the center of the first substrate 2. When a plurality of the spacers 4 are arranged, the sizes (distances H) of gaps 6 formed by the spacers 4 can be different from one another or can be the same. However, it is desirable to set the sizes of the gaps 6 such that the joint interface 9 expands from the joining starting point 8 in an isotropic manner. When the distances H formed by the spacers 4 are set the same, to expand the joint interface in an isotropic manner, it is desirable to arrange the spacers 4 such that distances A between the spacers 4 and the joining starting point 8 are set the same. The spacer 4 only has to separate the second substrate 3 and the first substrate 2 by a predetermined distance. The spacer 4 can be in contact with or can be not in contact with the first substrate 2.

A method of calculating joining speed in this embodiment is explained below. As shown in FIGS. 1 and 2, a distance between the joining starting point 8 and an end point (on the joining starting point 8) is represented as distance A, a distance between the joining starting point and the joint interface 9 is represented as expansion distance B, and a distance between the joint interface 9 and the spacer 4 is represented as distance C.

When the joint surface 2a and the joint surface 3a are opposed to each other without setting the spacer 4 (as in the past) and the joining starting point 8 is pressed, the joint interface 9 ideally expands around the joining starting point 8 in an isotropic manner as explained above. However, actually, depending on a state (flatness, etc.) of the surfaces of the joint surface 2a and the joint surface 3a, a state in which a distance between the joint surface 2a and the joint surface 3a is smaller at another point (a point other than the pressed point) near the pressed point than at the pressed point occurs. In such a case, it is difficult to calculate a starting point of joining. Expansion speed of the joint interface 9 cannot be correctly calculated. On the other hand, in this embodiment, the spacer 4 is inserted between the joint surface 2a and the joint surface 3a to form the gap 6 to thereby prevent the start of joining from a point other than the pressed point. In other words, the spacer 4 is used to set the pressed point as the joining starting point 8. Therefore, in this embodiment, it is possible to calculate expansion speed of the joint interface 9 with the pressed point set as the joining starting point 8.

The distance H caused by the gap 6 is appropriately set according to the size or the like of the first substrate. For example, if the diameter of the first substrate 2 is 300 millimeters, when the maximum of the distance H is set to about 100 micrometers to 500 micrometers, expansion speed can be appropriately measured. The size of the gap 6 is explained with reference to the maximum of the distance H between the joint surfaces. However, the size of the gap 6 can be set according to other indexes such as an average, a median, or the like of the distance H between the joint surfaces rather than the maximum of the distance H between the joint surfaces.

A method of calculating expansion speed in this embodiment is explained below. In this embodiment, the sensor unit 10 images an image of an region including the joint surface 2a and the joint surface 3a from the rear surface side of the second substrate 3 and outputs imaged image data to the processing unit 11. The processing unit 11 calculates, based on the image data imaged by the sensor unit 10, expansion speed of the joint interface 9.

Specifically, for example, the image data imaged by the sensor unit 10 is image data in which a change in luminance occurs in the joint interface 9 shown in FIG. 2. Therefore, the processing unit 11 calculates a position where the change in luminance occurs. The processing unit 11 calculates the position of the joint interface 9 on a straight line that connects the joining starting point 8 and the spacer 4. An update period of the image data (an imaging period of the sensor unit 10) is set, according to assumed expansion speed, to be equal to or larger than an update period at which expansion speed can be calculated at appropriate resolution.

As a method of calculating expansion speed, a moving distance of the joint interface 9 is calculated for each predetermined time interval and an average of moving distances is calculated. It is assumed that the joining starting point 8 coincides with the pressed point. The known pressed point is set as the joining starting point 8. For example, there is a method of dividing a distance from the joining starting point 8 to a predetermined position by elapsed time from the start of joining until the joint interface 9 reaches the predetermined position. For example, a position located on the spacer 4 side by ⅓ of the distance A from the joining starting point on the straight line that connects the joining starting point 8 and the spacer 4 is set as a measurement position. Time from the start of joining until the joint interface 9 reaches the measurement position is calculated as elapsed time. Expansion speed can be calculated by dividing ⅓×A by the elapsed time.

As the time from the start of joining until the joint interface 9 reaches the measurement position, time from joining start time until acquisition time of image data in which the calculated position of the joint interface 9 crosses over the measurement position for the first time can be set as elapsed time. Time when the joint interface 9 passes the measurement position can be estimated based on the position of the joint interface 9 calculated based the image data in which the calculated position of the joint interface 9 crosses over the measurement position for the first time and the position of the joint interface 9 calculated based on image data immediately before the image data. Time from the joining start time until the estimated time can be set as elapsed time.

The processing unit 11 estimates, based on the calculated expansion speed, time when the joint interface 9 reaches the end point of the spacer 4 and performs control to remove the spacer 4 from between the joint surface 2a and the joint surface 3a before the estimated time comes. Specifically, for example, the processing unit 11 moves the spacer 4 in a direction away from the joining starting point 8 to thereby remove the spacer 4 from between the joint surface 2a and the joint surface 3a. In this way, the spacer 4 can be inserted between the joint surface 2a and the joint surface 3a and removed from between the joint surface 2a and the joint surface 3a according to the control by the processing unit 11 or not-shown another control device.

The processing unit 11 determines whether the calculated expansion speed is within a predetermined range. The predetermined range depends on, for example, a material of an oxide film on the front surface of a substrate to be joined. For example, the predetermined range is set to a range of about 10 mm/s to 50 mm/s. For example, minimum expansion speed at which a void or the like does not occur is calculated by an analysis, an experiment, or the like in advance and the expansion speed is set as a lower limit of this predetermined range. Concerning an upper limit of the predetermined range, for example, a value at which the spacer 4 can be removed until the joint interface 9 reaches the end point of the spacer 4 is set. When the spacer 4 can be removed until the joint interface 9 reaches the end point of the spacer 4 irrespective of expansion speed, the upper limit does not have to be provided.

In the example explained above, expansion speed up to the measurement position is calculated. However, expansion speed can be calculated at every predetermined time to calculate a time history of the expansion speed. It may be determined based on the time history whether expansion speeds are within the predetermined range. Further, a restriction on a temporal change of expansion speed can be provided. For example, when expansion speed suddenly changes, it is determined that abnormality occurs.

In the example explained above, expansion speed in one direction from the joining starting point 8 to the spacer 4 is calculated. However, expansion speeds in two or more directions centering on the joining starting point 8 can be calculated. In that case, it can be determined whether the expansion speeds in the directions are within the predetermined range. It can be determined whether an average of the expansion speeds in the directions is within the predetermined range. Further, in this case, a difference due to a direction of expansion speed can also be calculated. Therefore, for example, it is possible to detect, using this difference, abnormality of the joint interface 9 not expanding in an isotropic manner.

Figure 3:
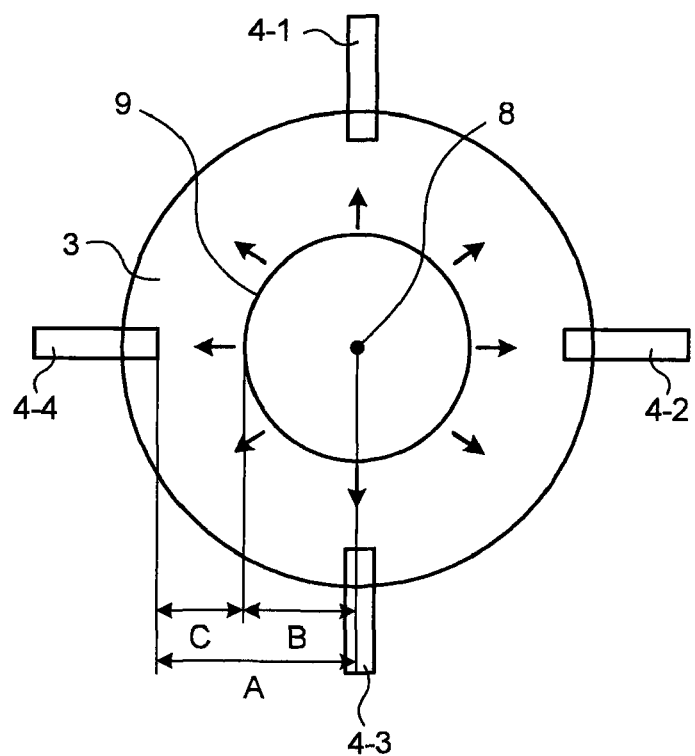
FIG. 3 is a diagram of an example of a joined state in which the centers of the first substrate and the second substrate are pressed.

In the examples shown in FIGS. 1 and 2, the joining starting point 8 (the point to be pressed) is set at the end of the first substrate 2. However, the joining starting point 8 is not limited to this and can be set in any position on the first substrate 2. FIG. 3 is a diagram of an example of a joined state in which the centers of the first substrate 2 and the second substrate 3 are pressed. In the example shown in FIG. 3, the pressing member 7 is arranged on the center of the first substrate 2. The center of the first substrate 2 is arranged to be the joining starting point 8.

When the center is pressed in this way, to expand the joint interface in an isotropic manner, a plurality of spacers for setting the distance A to the joining starting point 8 the same can be arranged. In the example shown in FIG. 3, four spacers 4-1 to 4-4 are arranged. A function and a material of the spacers 4-1 to 4-4 are the same as those of the spacer 4 explained above. In the example shown in FIG. 3, the spacers 4-1 to 4-4 are arranged from the periphery of the first substrate 2 toward the joining starting point 8 to set the distance A to the joining starting point 8 the same. When the center of the first substrate 2 is pressed, one spacer can be provided. However, it is desirable to use a plurality of spacers such that isotropic expansion is performed. The number of spacers is not limited to four shown in FIG. 3 and can be any number.

Concerning the first substrate 2 and the second substrate 3, organic matters such as carbon and metal contaminants such as Cu and Al are removed from the joint surface 2a and the joint surface 3a by a cleaning process before the first substrate 2 and the second substrate 3 are carried into the semiconductor manufacturing apparatus 1. By performing such a cleaning process, fluctuation in surface states of the joint surface 2a and the joint surface 3a is reduced. Therefore, it is easy to calculate expansion speed of the joint interface 9.

The cleaning process can be a wet process such as organic cleaning by acetone, alcohol, ozone water (O3), or the like or acid alkali cleaning by hydrogen fluoride (HF), diluted hydrogen fluoride (DHF), a sulfuric acid/hydrogen peroxide mixture, an ammonium/hydrogen peroxide mixture, or a hydrochloric acid/hydrogen peroxide mixture. The cleaning process can be a dry process such as plasma processing excited by single gas or a plurality of gases of hydrogen, nitrogen, oxygen, dinitrogen oxide (N2O), argon, helium, and the like. Further, the cleaning process can be a combination of the wet process and the dry process. It is desirable that the cleaning process is applied to both the joint surface 2a of the first substrate 2 and the joint surface 3a of the second substrate 3. However, the cleaning process can be applied to one of the joint surface 2a and the joint surface 3a.

As the sensor unit 10, a sensor that uses any wave length such as a single wavelength laser, visible light, infrared light, an X ray, or ultrasound can be used as long as the sensor can acquire image data having space resolution that allows detection of the joint interface (an interface between a joint surface and a non-joint surface of the first substrate and the second substrate). For example, when a substrate to be joined is invisible like a silicon substrate and a joining system is direct joining in the atmosphere or the vacuum, it is desirable that the sensor unit 10 is an infrared camera of a reflection type or a transmission type. When the substrate to be joined is a transparent substrate made of a material such as glass, a sensor that uses visible light can be used.

As a material of the stage 5, any one of an inorganic material, a metal material, and a resin material can be selected. However, when the joint interface 9 is detected by visible light or infrared light, it is suitable that the stage 5 is made of the inorganic material such as glass, quartz, or silicon or the resin material.

When a gap is formed between the stage 5 and the first substrate 2, because, for example, interference fringes occur in acquired image data, deterioration in accuracy of calculation of expansion speed by the sensor unit 10 and the processing unit 11 is caused. Therefore, the stage 5 is desirably flat.

For example, when warp occurs in the first substrate 2, in some case, a gap is formed between the stage 5 and the first substrate 2 and a focus in imaging by the sensor unit 10 shifts. To prevent the formation of the gap, the stage 5 can include an attracting mechanism for attracting the first substrate 2. A system for this attraction can be any system such as vacuum chuck (a large number of holes, grooves, or a porous material or a combination of the holes, the grooves, and the porous material) or electrostatic chuck. In the case of the vacuum chuck, a stage material can be formed of an inorganic material such as glass, quartz, or silicon, a ceramic material such as alumina (Al2O3), a resin material such as fluorine resin, polyetheretherketone (PEEK (registered trademark)), or conductive PEEK (registered trademark) mixed with carbon, stainless steel grains, or the like. However, to prevent heavy metal contamination by Cu or the like on the rear surface of the first substrate 2, it is desirable that the stage material is formed of the inorganic material or the resin material. In the case of the electrostatic chuck, aluminum nitride (AlN), alumina, single crystal sapphire, or the like is suitable.

The stage 5 is means for holding a substrate to be joined. Because flatness and the like are required of the stage 5, it is desirable that the stage 5 is a component dedicated to the semiconductor manufacturing apparatus 1. However, for example, when means for holding the substrate to be joined flat is separately prepared, the semiconductor manufacturing apparatus 1 does not have to include the stage 5.

In this embodiment, the sensor unit 10 acquires image data. However, a method other than the method of acquiring image data can be adopted as long as the method is a method of detecting the joint interface 9. For example, the sensor unit 10 can be a sensor that acquires luminance on a line in a predetermined direction from the joining starting point 8 using a single wavelength laser, visible light, infrared light, an X ray, ultrasound, or the like and outputs, as the position of the joint interface 9, only a position where a change in the luminance occurs.

In this embodiment, the shape of the first substrate 2 and the second substrate 3 is a circle. However, the shape of the substrates is not limited to this and can be any shape. For example, in the case of a square, the substrates are pressed from the center. The spacers are set at vertexes. When the spacers 4 are set at middle points of sides, the joint interface 9 can be expanded in an isotropic manner.

In this embodiment, expansion speed of the joint interface 9 is calculated as an index indicating an expansion degree of joining (joining force) and it is determined based on the expansion speed whether the joining is normally performed. However, a method of determining whether the joining is normally performed is not limited to this and only has to be a method of determining based on a rate of change of the joint interface 9 whether the joining is normally performed. For example, a ratio of a joint area (an inner side region of the joint interface 9) to a predetermined area of the first substrate 2 (which can be the entire substrate, can be an inner side region excluding several millimeters of the periphery, or can be a region formed by a single or a plurality of rectangles, circles, or polygons) can be calculated for each predetermined time to calculate a time history of the joint area. It can be determined based on the time history whether the joint area is within a predetermined range. Further, a restriction on a temporal change of the joint area can be provided. For example, when the joint area is smaller than the predetermined area, it is determined that abnormality occurs. Therefore, an index indicating the joining force other than the expansion speed can be calculated based on image data or the like. It can be determined based on the index whether the joining is normally performed.

In the example explained above, the spacer 4 is removed based on expansion speed. However, the removal of the spacer 4 is not limited to this. The spacer 4 can be removed based on a distance from the joining starting point to the joint interface (an expansion distance). For example, the processing unit 11 performs control to remove the spacer 4 from between the joint surface 2a and the joint surface 3a when the joint interface reaches a predetermined distance from the joining starting point set in advance. For example, a maximum expansion distance of the joint interface 9 at which a void or the like does not occur is calculated by an analysis, an experiment, or the like in advance and the predetermined distance is set shorter than the expansion distance.

For example, a distance B from the joining starting point on a straight line that connects the joining starting point 8 and the spacer 4 is set as the predetermined distance. When the joint interface 9 reaches a position of the distance B (a position where the distance from the joining starting point is the distance B), the spacer 4 is moved in a direction away from the joining starting point 8, whereby the spacer 4 is removed from between the joint surface 2a and the joint surface 3a.

Further, the predetermined distance B can be divided by time when the joint interface 9 reaches the predetermined distance B from joining starting time to calculate joining expansion speed and determine whether the joining expansion speed is within a predetermined range.

In the example explained above, expansion speed in one direction from the joining starting point 8 to the spacer 4 is calculated. However, expansion speeds in two or more directions centering on the joining starting point 8 can be managed. In that case, it is desirable to remove the spacers 4 from between the joint surface 2a and the joint surface 3a when expansion distances of the joint interface 9 in the directions reach the predetermined distance B first. It is possible to detect, using a time difference of the expansion distances of the joint interface 9 in the directions reaching the predetermined distance B, abnormality of the joint interfaces 9 not expanding in an isotropic manner.

As explained above, in the semiconductor manufacturing apparatus 1 according to this embodiment, a gap is formed between the joint surface 2a and the joint surface 3a by the spacer 4. The sensor unit 10 images image data from the rear surface side of the second substrate 3. The processing unit 11 sets, based on the image data, a pressed point as the joining starting point 8 and calculates, based on a state of movement of the joint interface 9 from the joining starting point 8, joining force and determines, according to whether the joining force (in this embodiment, expansion speed) is within the predetermined range, whether joining is normally performed. Therefore, an entrainment void is not formed in the joint interface 9 between the first substrate 2 and the second substrate 3. It is possible to select a substrate in a satisfactory joined state. Therefore, it is possible to improve yield in subsequent processes and improve efficiency of manufacturing of a semiconductor device. Further, because substrates not normally joined are removed, it is possible to prevent deformation of substrates after joining.

The processing unit 11 removes, based on expansion speed of the joint interface 9, the spacer 4 at timing when the spacer 4 does not hinder expansion of the joint interface 9. Therefore, it is possible to calculate joining force without hindering expansion of joining.

The stage 5 includes the attracting mechanism. Therefore, even if the first substrate 2 warps, it is possible to flatten the first substrate 2 on the stage 5, suppress a focus shift between the sensor unit 10 and the joint interface 9, and easily detect the expansion distance B of the joint interface 9.

Further, the infrared camera of the transmission type or the reflection type is provided as the sensor unit 10. Therefore, even if the second substrate 3 is not made of a light transmissive material, it is possible to easily detect the expansion distance B of the joint interface 9. Further, because the stage 5 is made of the inorganic material such as glass, quartz, or silicon or the resin material, the stage 5 tends to transmit visible light and infrared light. Therefore, it is possible to easily detect the expansion distance B of the joint interface 9. In this case, it is also possible to set the sensor unit 10 under the stage 5. Therefore, a degree of freedom of apparatus design is improved.

Figure 4:
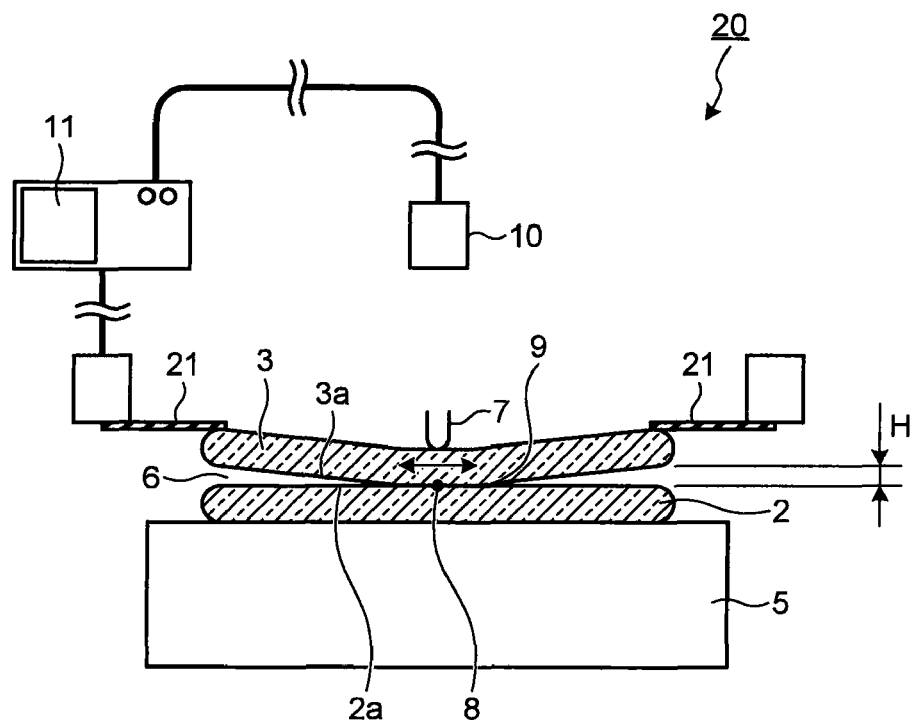
FIG. 4 is a diagram of a configuration example of a semiconductor manufacturing apparatus according to a second embodiment.

FIG. 4 is a diagram of a configuration example of a semiconductor manufacturing apparatus 20 according to a second embodiment. The semiconductor manufacturing apparatus 20 according to this embodiment is a semiconductor manufacturing apparatus for directly joining the first substrate 2 and the second substrate 3. The semiconductor manufacturing apparatus 20 according to this embodiment includes a member 21, the stage 5, the pressing member 7, the sensor unit 10, and the processing unit 11.

In FIG. 4, the first substrate 2 same as that in the first embodiment is mounted on the stage 5 of the semiconductor manufacturing apparatus 20. The first substrate 2 can be, for example, a semiconductor substrate. An active layer (not shown) in which a photodiode and a transistor are formed and a wiring layer (not shown) electrically connected to the active layer are formed on the front surface of the first substrate 2. The active layer and the wiring layer are covered with an insulating layer 2a serving as a joint surface.

The second substrate 3 is arranged to oppose the joint surface 3a to the joint surface 2a of the first substrate 2. The periphery of the rear surface (the surface on the opposite side of the joint surface 3a) of the second substrate 3 is attracted by the member 21. The gap 6 for setting a distance between the joint surface 2a and the joint surface 3a to a predetermined value is formed by this attraction.

It is desirable to arrange the member 21 at vertexes of a regular polygon (triangle or square) centering on the center of gravity of the second substrate 3 as shown in FIG. 3 explained in the first embodiment because it is possible to make deformation of the second substrate 3 symmetry during joining. However, the member 21 can be arranged in a plurality of arbitrary places. The member 21 can be formed in a ring-like shape.

The member 21 can have a stage-like attracting mechanism. A system for the attraction can be any system such as vacuum chuck (a large number of holes, grooves, or a porous material or a combination of the holes, the grooves, and the porous material) or electrostatic chuck. In the case of the vacuum chuck, a stage material can be formed of an inorganic material such as glass, quartz, or silicon, a ceramic material such as alumina (Al2O3), a resin material such as Teflon, polyetheretherketone (PEEK (registered trademark), or conductive PEEK (registered trademark) mixed with carbon, stainless steel grains, or the like. However, it is desirable that the stage material is formed of the inorganic material or the resin material because there is no heavy metal contamination by Cu or the like on the rear surface of the first substrate 2. In the case of the electrostatic chuck, aluminum nitride (AlN), alumina, single crystal sapphire, or the like is suitable.

When the member 21 includes the stage-like attracting mechanism, if the member 21 is formed of a transparent material such as quartz or acrylic and the sensor unit 10 is a sensor that uses light such as infrared light, it is possible to detect expansion of the joint interface 9 as in the first embodiment. If an opening for measurement in the sensor unit 10 is provided in the member 21, a wavelength of the sensor unit 10 can be chosen from a wider range of options. If the opening is provided in the member 21 in a position corresponding to the pressing member 7, it is possible to press a surface on the opposite side of the joint surface 3a of the second substrate 3. For example, if a plurality of attracting sections (e.g., attracting grooves) of the member 21 are provided from the center in a concentric shape, it is possible to stop the attraction from the center according to expansion of the joint interface. The attraction by the member 21 does not hinder the expansion of the joint interface 9.

The processing unit 11 releases, based on expansion speed or an expansion distance, the attraction of the second substrate 3 by the member 21 not to hinder joining. For example, the processing unit 11 releases the attraction when the expansion distance reaches the distance B in the same manner as the removal of the spacer 4 in the first embodiment. Operations in this embodiment are the same as those in the first embodiment except that the gap 6 is formed using the member 21 instead of the spacer 4 and the attraction by the member 21 is released instead of removing the spacer 4.

With the semiconductor manufacturing apparatus 20 according to this embodiment, in addition to effects same as those in the first embodiment, because the member 21 attracts the rear surface of the second substrate 3, there is no concern about a delay of removal timing of the spacer 4 due to the influence of friction between the spacer 4 and the joint surface 3a of the second substrate 3. Therefore, it is possible to obtain high joining force further without hindering expansion of the joint interface 9 compared with the first embodiment.

The components, the shapes, the sizes, and the arrangement relations explained in this embodiment are merely explained schematically enough for understanding and carrying out the present invention. The numerical values and the compositions (the materials) of the components are merely examples. Therefore, the present invention is not limited by the embodiments and can be realized in various forms without departing from the scope of the technical idea of the embodiments.

While certain embodiments have been described, these embodiments have been presented by way of example only, and are not intended to limit the scope of the inventions. Indeed, the novel embodiments described herein may be embodied in a variety of other forms; furthermore, various omissions, substitutions and changes in the form of the embodiments described herein may be made without departing from the spirit of the inventions. The accompanying claims and their equivalents are intended to cover such forms or modifications as would fall within the scope and spirit of the inventions.

What is claimed is:

1. A semiconductor manufacturing method for joining a joint surface of a first substrate and a joint surface of a second substrate, the semiconductor manufacturing method comprising:

pressing the first substrate and the second substrate, which are arranged to oppose the joint surfaces thereof each other, in a predetermined position on an opposite surface of the joint surface of the second substrate such that the joint surface of the first substrate and the joint surface of the second substrate are in contact with each other;

restraining the second substrate with a member to provide a gap between the joint surface of the first substrate and the joint surface of the second substrate;

imaging an image including a plane area of the first substrate from the opposite surface side of the joint surface of the second substrate or from an opposite surface side of the joint surface of the first substrate; and calculating, based on the image, a joint interface and determining, based on a rate of change of the joint interface, whether joining is normally performed.

2. The semiconductor manufacturing method according to claim 1, further comprising calculating an expansion distance of the joint interface, determining that the expansion distance reaches a predetermined range, and performing control to release the restraint of the second substrate.

3. The semiconductor manufacturing method according to claim 1, wherein the image is an infrared image.

4. A semiconductor manufacturing apparatus that joins a joint surface of a first substrate and a joint surface of a second substrate, the semiconductor manufacturing apparatus comprising:

a pressing unit that presses the first substrate and the second substrate, which are arranged to oppose the joint surfaces thereof each other, in a predetermined position on an opposite surface of the joint surface of the second substrate such that the joint surface of the first substrate and the joint surface of the second substrate are in contact with each other;

a member that restrains the second substrate to provide a gap between the joint surface of the first substrate and the joint surface of the second substrate;

a sensor unit that images an image including a plane area of the first substrate from the opposite surface side of the joint surface of the second substrate or from an opposite surface side of the joint surface of the first substrate; and a processing unit that calculates, based on the image, a joint interface and determines, based on a rate of change of the joint interface, whether joining is normally performed.

5. The semiconductor manufacturing apparatus according to claim 4, wherein the member that restrains the second substrate is a spacer arranged on an periphery of the first substrate to be located between the joint surface of the first substrate and the joint surface of the second substrate.

6. The semiconductor manufacturing apparatus according to claim 5, wherein
the predetermined position is an end of the first substrate, and
the spacer is arranged on an extended line of a straight line extending from the end of the first substrate to a center of the first substrate.

7. The semiconductor manufacturing apparatus according to claim 5, wherein a plurality of the spacers are arranged such that distances from the predetermined position to the spacers are equal to one another.

8. The semiconductor manufacturing apparatus according to claim 4, wherein the member that restrains the second substrate attracts the opposite surface of the joint surface of the second substrate.

9. The semiconductor manufacturing apparatus according to claim 4, wherein the processing unit calculates expansion speed, which is moving speed, of the joint interface as the rate of change of the joint interface.

10. The semiconductor manufacturing apparatus according to claim 9, wherein the processing unit determines, when the expansion speed is within a predetermined range, that the joining is normally performed.

11. The semiconductor manufacturing apparatus according to claim 9, wherein the processing unit performs, based on the expansion speed, control to release the restraint of the second substrate.

12. The semiconductor manufacturing apparatus according to claim 9, wherein the processing unit calculates moving speed of the joint interface concerning a plurality of directions centering on the predetermined position and calculates, based on a plurality of the moving speeds, the expansion speed.

13. The semiconductor manufacturing apparatus according to claim 12, wherein the expansion speed is an average of the moving speeds.

14. The semiconductor manufacturing apparatus according to claim 12, wherein the processing unit further determines whether a difference among the moving speeds is equal to or larger than a predetermined value.

15. The semiconductor manufacturing apparatus according to claim 9, wherein the processing unit calculates a time history of the expansion speed and further determines whether a rate of change of the expansion speed is within a predetermined range.

16. The semiconductor manufacturing apparatus according to claim 4, wherein the processing unit calculates an expansion distance of the joint interface and performs, based on whether the expansion distance reaches a predetermined range, control to release the restraint of the second substrate.

17. The semiconductor manufacturing apparatus according to claim 4, wherein the predetermined position is a center of the first substrate.

18. The semiconductor manufacturing apparatus according to claim 4, wherein the sensor unit is an infrared camera.

19. The semiconductor manufacturing apparatus according to claim 4, wherein
at least one of the first substrate and the second substrate is a transparent substrate, and
the sensor unit is a visible light camera.

20. The semiconductor manufacturing apparatus according to claim 1, further comprising a stage that holds the first substrate such that the opposite surface of the joint surface is in contact with the stage.

* * * * *